（12） United States Patent
Kuriyama et al.

(10) Patent No.: US 6,495,004 B1
(45) Date of Patent: Dec. 17, 2002

(54) SUBSTRATE PLATING APPARATUS

(75) Inventors: Fumio Kuriyama, Tokyo (JP); Naoaki Ogure, Tokyo (JP); Akihisa Hongo, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/555,650
(22) PCT Filed: Oct. 4, 1999
(86) PCT No.: PCT/JP99/05439

§ 371 (c)(1),
(2), (4) Date: Jun. 29, 2000

(87) PCT Pub. No.: WO00/20663

PCT Pub. Date: Apr. 13, 2000

(30) Foreign Application Priority Data

Oct. 5, 1998 (JP) .......................................... 10-282844
Oct. 5, 1998 (JP) .......................................... 10-282845

(51) Int. Cl.⁷ ........................... C25D 17/00; B05C 3/02; B08B 3/00
(52) U.S. Cl. ................... 204/198; 204/224 R; 118/407; 134/61
(58) Field of Search ........................... 118/407; 134/61, 134/901; 204/198, 224 R

(56) References Cited

U.S. PATENT DOCUMENTS

| 4,746,414 A | * | 5/1988 | Carpenter et al. | .......... 204/240 |
| 5,887,604 A | * | 3/1999 | Murakami et al. | ....... 134/102.2 |
| 5,932,077 A | * | 8/1999 | Reynolds | ................ 204/224 R |
| 5,935,330 A | * | 8/1999 | Taniguchi | .................... 118/66 |
| 5,960,956 A | * | 10/1999 | Langanki et al. | ........... 206/440 |

FOREIGN PATENT DOCUMENTS

| JP | 63-255821 | 10/1988 |
| JP | 9-289185 | 11/1994 |
| JP | 9-289185 | 11/1997 |

* cited by examiner

Primary Examiner—Donald R. Valentine
(74) Attorney, Agent, or Firm—Wenderoth, Lind & Ponack, L.L.P.

(57) ABSTRACT

A substrate plating apparatus forms a plating layer on the surface of a substrate and stores the substrate until the next process in a way that the substrate is not exposed to the atmosphere. The substrate plating apparatus is not only capable of introducing semiconductor wafers continuously one by one into the plating apparatus without loading the wafers into cassettes, but is also capable of preventing particle contamination and the formation of oxidized film on the surface of the wafers, thus reducing the number of process and reducing the installation area required for the apparatus. The substrate plating apparatus includes a plating process section (20) for plating a substrate, a washing process section (10) for washing the substrate after the plating process, and a storage vessel (16) containing a storing solution in which the substrate is immersed after having been plated and washed. A substrate conveyor is provided in the substrate plating apparatus for loading substrates into the substrate plating apparatus and discharging substrates out of the substrate plating apparatus, or for performing at least one of the loading or discharging operations, such that the substrates are loaded into the substrate plating apparatus one at a time, plated in the plating process section, washed in the washing process section, and subsequently discharged one at a time from the substrate plating apparatus.

16 Claims, 13 Drawing Sheets

F I G. 1
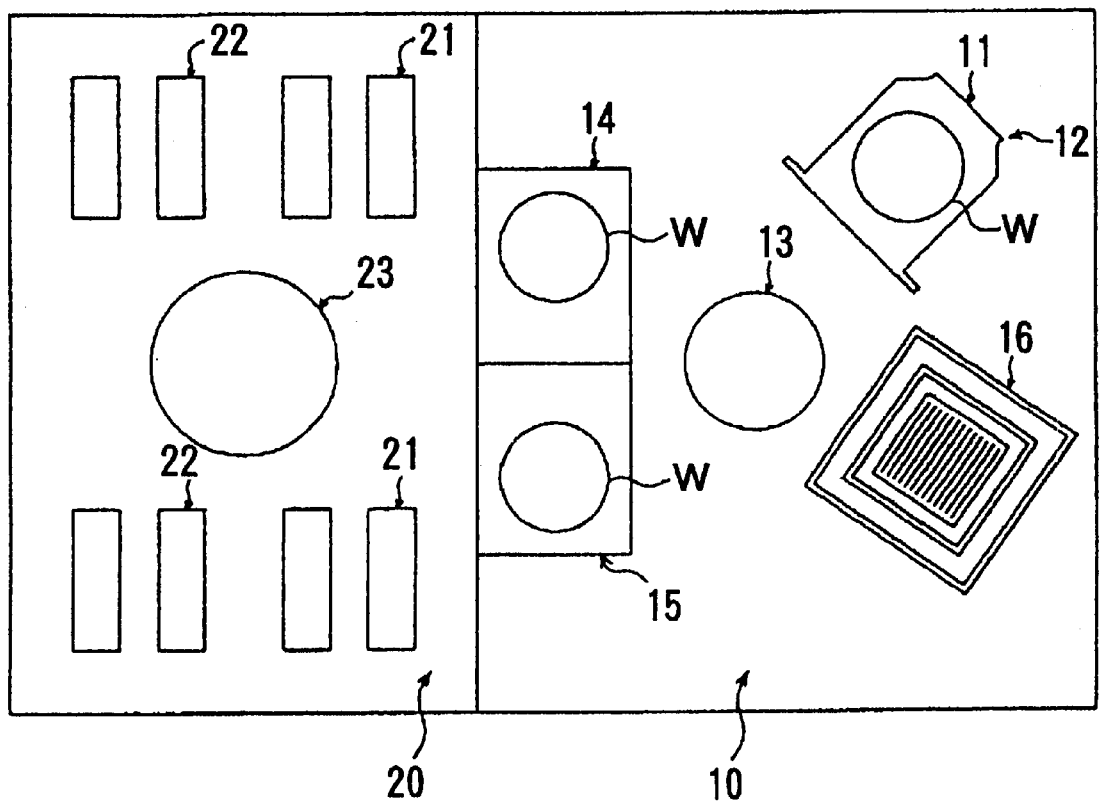

F I G. 3
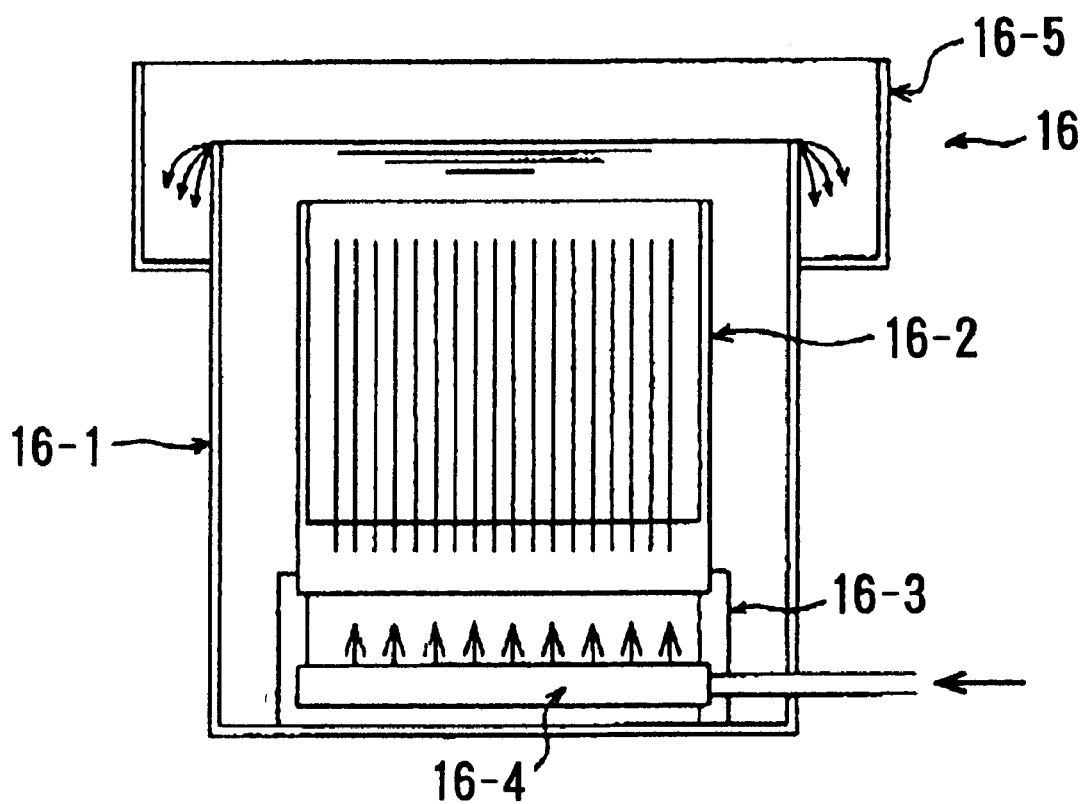

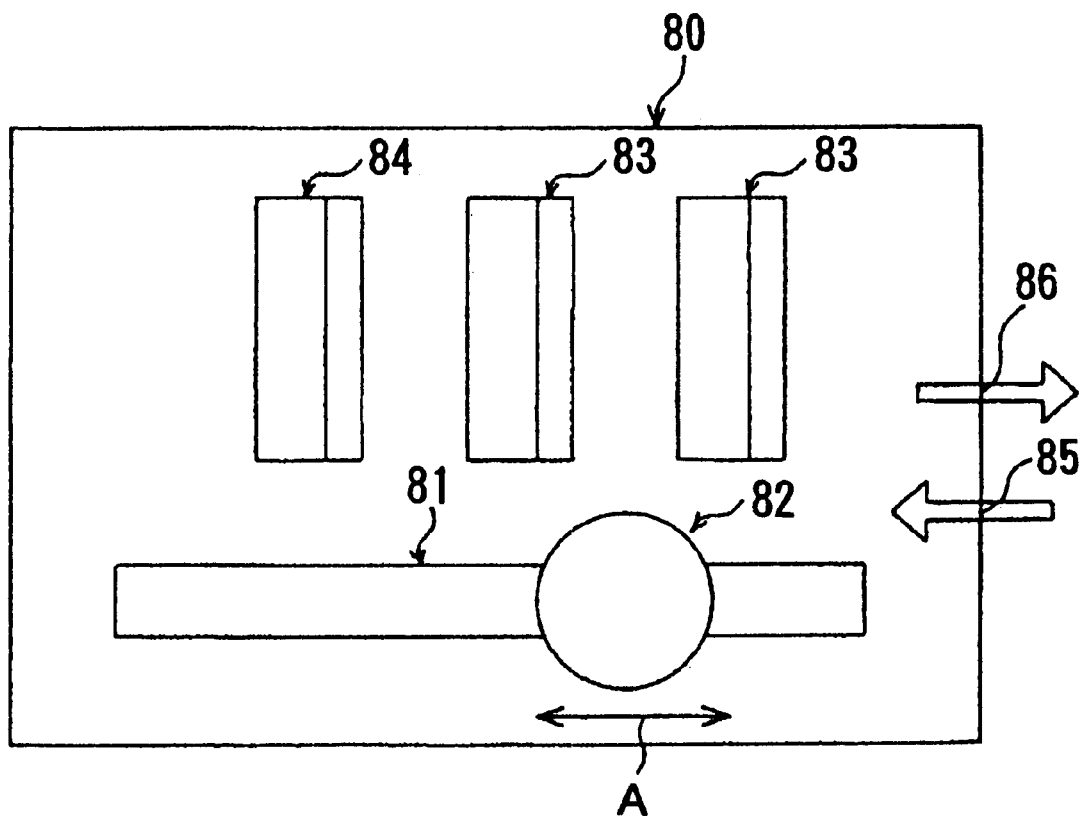
F I G. 7

F I G. 8
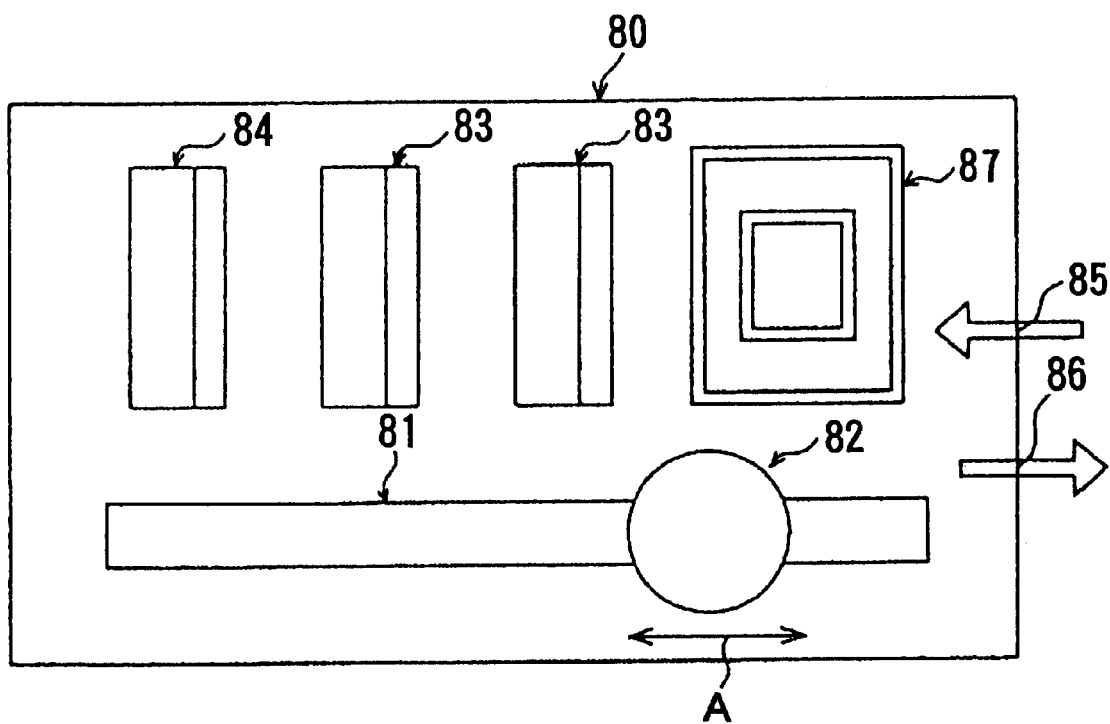

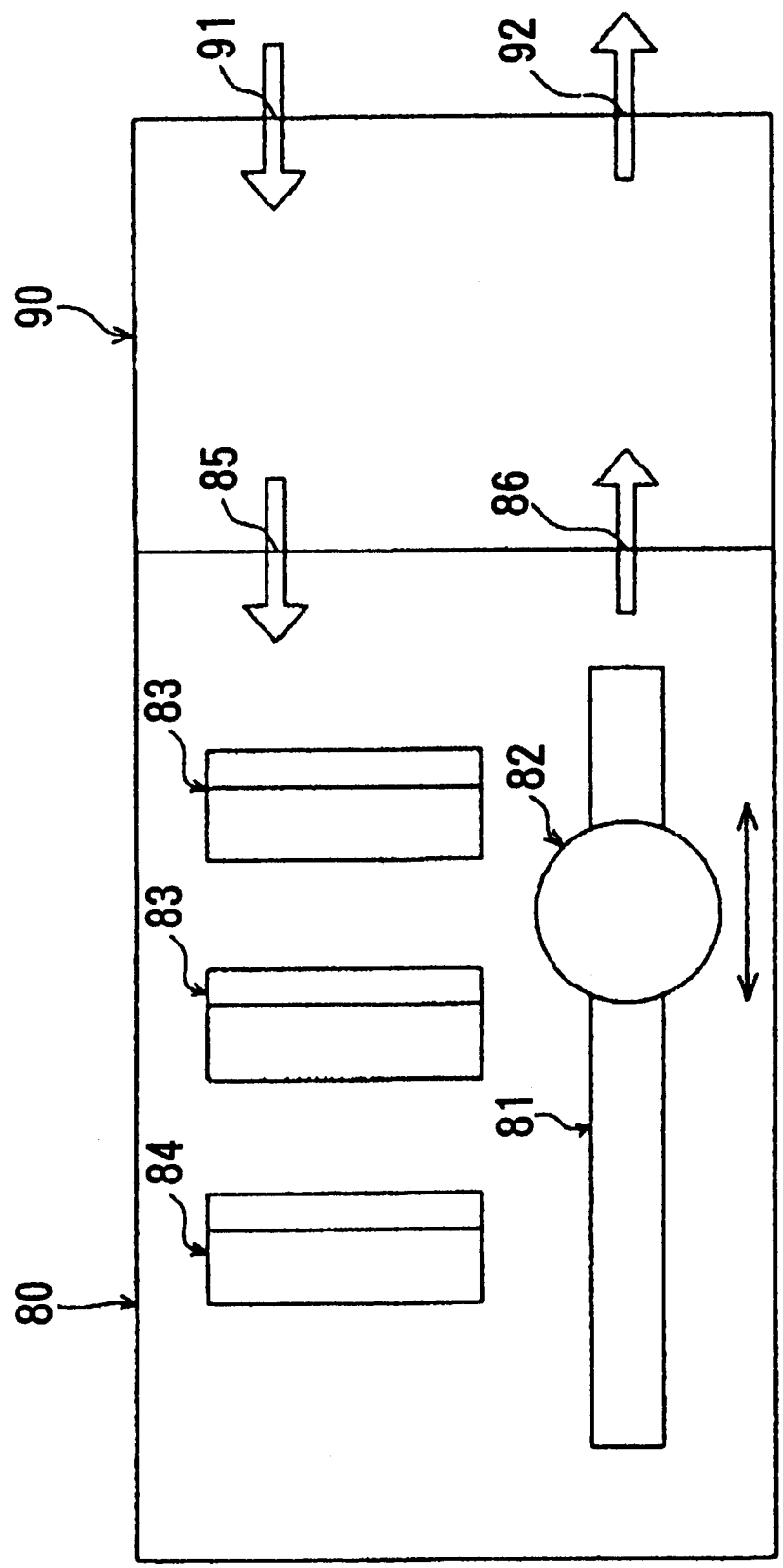

SUBSTRATE PLATING APPARATUS

TECHNICAL FIELD

The present invention relates to a plating apparatus for plating a substrate such as a semiconductor wafer or the like, and particularly to a substrate plating apparatus for forming a wiring layer in a wiring portion comprising fine channels and/or fine holes formed in the surface of a substrate.

BACKGROUND ART

Aluminum wiring is well known for its common use as the wiring material for forming circuits in semiconductor devices. One of the most common methods for forming wiring patterns in a semiconductor device has been the etch-back method of an aluminum layer which is sputtered thereon. However, this method can be very difficult when forming wiring patterns using other metal materials, such as copper or the like. In this case, the common method is to form channels and holes for wiring in the substrate, implant metal material in the channels and holes, and subsequently perform chemical mechanical polishing (CMP) on the surface of the substrate.

However, as the level of integration in semiconductor devices increases, forcing a finer pattern in wiring scale as well as in the width of the wires, the step coverage increases and conventional methods of sputtering are limited in their ability to implant metal into a wiring area composed of fine channels and holes (fine contact holes). There is a tendency for voids to be formed in the wiring area.

Due to the increased functionality of semiconductor devices, it is necessary to form wiring channels and wiring holes having widths of 0.18 μm or 0.13 μm. However, it is difficult to implant metal materials in such miniaturized channels and holes using the sputtering method. Therefore, it is required to develop a new technique to use in place of sputtering. This technique will use one apparatus to perform either electrolytic plating or electroless plating to form a copper (Cu) plated layer on the surface of a semiconductor wafer including a wiring area having these type of fine channels and holes. The technique will include a process for removing the Cu plated layer from the surface of the semiconductor wafer while leaving a Cu plated layer in the wiring area.

Further, if the Cu plating apparatus and the CMP apparatus are provided separately, the surface of the Cu plating film may oxidize or particles may be attached on the surface when the device is exposed to the air after the plating and cleaning processes.

Further, when the Cu plating apparatus and the CMP apparatus are separated, an extra drying process is needed. That is, after the semiconductor wafer has been plated in the Cu plating apparatus, the wafer is dried and transported out of the apparatus. The wafer is then conveyed into the CMP apparatus in its dried state. If an additional cover plating apparatus is required separately to form a cover plating over the top of the wire plated layer, the wafer must again be dried before being conveyed to the cover plating apparatus. In addition, oxidation on the surface of the wire plated layer progresses more with the passage of time.

Further, when forming a seed layer as a preprocess to the plating process using electroless Cu plating or electrolytic Cu plating having different liquid components, the semiconductor wafer is dried after completing these plating processes and inserted into a wafer cassette to be moved between apparatuses. However, it is possible to eliminate the drying process and the like by introducing the semiconductor wafer into the Cu plating apparatus while still coated with cleaning solution, that is, while the wafer is still wet. Feeding the semiconductor wafers continuously one by one into the Cu plating apparatus without drying and inserting the wafers into cassettes will reduce the amount of wafer contamination.

After the semiconductor wafers are introduced one at a time into the Cu plating apparatus, there is a waiting period before the wafers are plated. During this time the wafers can become contaminated with particles and an oxidation film may form on the surface. To prevent this from occurring, the wafers can be temporarily stored in pure water or dilute sulfuric acid, thereby eliminating the need to set a non-conducting time for removing the oxidized film from the surface of the wafer after immersing the wafer in plating solution.

Further, as the thickness of the seed layer in the holes becomes thinner due to the finer patterns of semiconductor devices, it is essential that etching processes for removing oxidized layers are reduced as much as possible. That is, it is important to minimize the formation of oxidized film before the plating process is conducted.

After the plating process is completed, the semiconductor wafers are continuously discharged one by one from the Cu plating apparatus and loaded into the CMP apparatus for the next process. Even though the Cu plating apparatus is separate from the CMP apparatus, by installing the CMP apparatus close to the Cu plating apparatus, it is possible to eliminate the unloading stage and, in some cases, the drying process, thereby reducing the amount of installation area required for the equipment.

DISCLOSURE OF INVENTION

In view of the foregoing, it is an object of the present invention to provide a substrate plating apparatus capable of forming a plating layer on the surface of a substrate and storing the substrate until the next process in a way that the substrate is not exposed to the atmosphere.

It is another object of the present invention to provide a substrate plating apparatus that can be easily configured to execute all steps continuously, including a process of forming a plating layer on the surface of a substrate and a CMP process which includes a wet process in which the plated layer is removed from the surface of the substrate without removing the plated layer from the wiring area.

It is another object of the present invention to provide a substrate plating apparatus not only capable of performing a process of introducing semiconductor wafers continuously one by one into the plating apparatus without loading the wafers into cassettes, but also capable of preventing particle contamination and the formation of oxidized film on the surface of the wafers, reducing the number of processes and reducing the installation area required for the apparatus.

These and other objects will be attained by a substrate plating apparatus having a plating process section for plating a surface of a substrate and a washing process section for washing the substrate after the substrate has been plated in the plating process section. The substrate plating apparatus comprises a substrate storage vessel containing a storing solution for storing the substrate in an immersed state after the substrate has been washed in the washing process section.

With this construction, the substrate storage vessel provided for immersing the substrate after the plating and washing processes prevents the substrate from being exposed to the air after being plated and before undergoing the next processing step. Accordingly, the present invention can prevent particle contamination and the formation of an oxidized film on the surface of the substrate.

According to another aspect of the present invention, there is provided a substrate plating apparatus having a plating process section for plating a substrate comprising an underwater substrate conveyor for conveying the substrate through a water channel containing flowing pure water after the substrate has been plated in the plating process section.

With this construction, the present invention enables transport of the substrate to the location of the next process without exposing the substrate to the air. Further, such wet and dry processes as CMP or washing processes can be provided at the downstream end of the substrate conveyor. Accordingly, it enables easy configuration of equipment capable of continuously conducting all processes, including wet processes, such as a plating process for forming a plating layer on the surface of the substrate, a CMP process for removing the plated layer from the surface of the substrate, leaving only the plating in the wiring section, and the like.

According to another aspect of the present invention, there is provided a substrate plating apparatus having a plating process section for plating a substrate and a washing process section for washing the substrate with a washing solution after the substrate has been plated in the plating process section. The apparatus comprises a substrate conveyor disposed in the substrate plating apparatus for loading substrates into the substrate plating apparatus and discharging substrates out of the substrate plating apparatus, or for performing at least one of the operations of loading or discharging the substrates. A plurality of the substrates to be plated in the plating process section are loaded into the substrate plating apparatus one at a time, plated in the plating process section, washed in the washing process section, and subsequently discharged one at a time from the substrate plating apparatus.

With this construction, when conducting a preprocess before the plating process, such as forming a seed layer using Cu electroless plating or electrolytic plating with differing liquid components, it is not necessary to dry the wafer, insert wafers into wafer cassettes, or transfer wafer cassettes between apparatuses after the wafers have been plated and washed. Instead, the wafers can be handled while still coated with cleaning solution, thereby eliminating the drying process. As a result, it is possible to reduce the overall equipment scale required to perform the processing.

BRIEF DESCRIPTION OF DRAWINGS

FIG. 1 is a plan view showing a first embodiment of a wire plating apparatus of the present invention;

FIG. 3 shows the construction of a storage vessel used in the wire plating apparatus;

FIG. 7 is a plan view showing a second embodiment of the substrate plating apparatus of the present invention;

FIG. 8 is a variation of the apparatus shown in FIG. 7;

FIG. 11 is a plan view showing that a plating apparatus for forming a seed layer is disposed adjacent to the substrate plating apparatus of the second embodiment;

BEST MODE FOR CARRYING OUT THE INVENTION

Figure 2A:
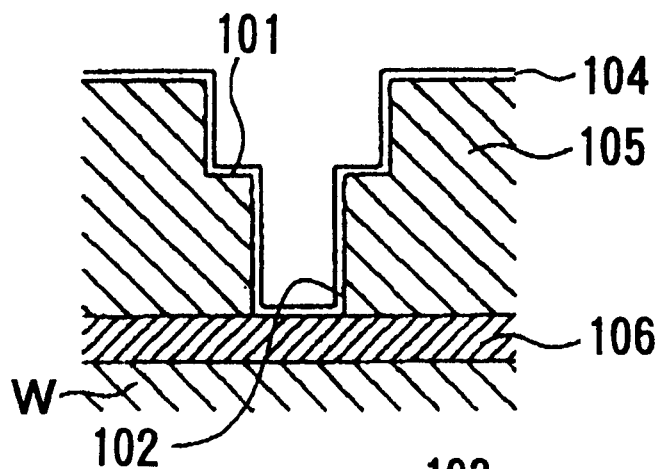
FIG. 2 shows cross-sectional views of a semiconductor wafer to illustrate a sample plating process performed using the substrate plating apparatus.

A first embodiment of the present invention will be described with reference to FIGS. 1 through 6. The substrate plating apparatus of the present embodiment will be described regarding an apparatus for performing wire plating on a semiconductor wafer, as an example. FIG. 1 is a plan view showing the wire plating apparatus of the present invention. As shown in the drawing, the wire plating apparatus comprises a loading and storing chamber 10 for loading and storing semiconductor wafers after they have been cleaned, and a plating process chamber 20 for performing the plating process.

The loading and storing chamber 10 is provided with a loading section 12 for loading cassettes 11 that accommodate unprocessed semiconductor wafers W, a robot 13, a loading stage 14 for depositing unprocessed semiconductor wafers W, a coarse washing vessel 15 for coarsely washing the wafers W, and a substrate storage vessel 16 which is used to store semiconductor wafers W after they have been washed by the coarse washing vessel 15. The plating process chamber 20 includes preprocess vessels 21, Cu plating vessels 22, and a robot 23.

In a wire plating apparatus having the construction described above, unprocessed semiconductor wafers W accommodated in the loading cassettes 11 are loaded into the loading section 12 by a wafer transferring device (not shown). The structure of the wafer W is shown in FIG. 2A. A conductive layer 106 is formed on top of the semiconductor wafer W. A SiO$_2$ insulating film 105 is formed on top of the conductive layer 106. A wire channel 101 and a wire hole 102 are formed in the insulating film 105 by a lithography etching technique. The wafer also includes a barrier layer 104 formed of TiN or the like formed over the surface of the insulating film 105 and the like. The robot 13 picks up an unprocessed semiconductor wafer W and places the wafer W on the loading stage 14.

Figure 2B:
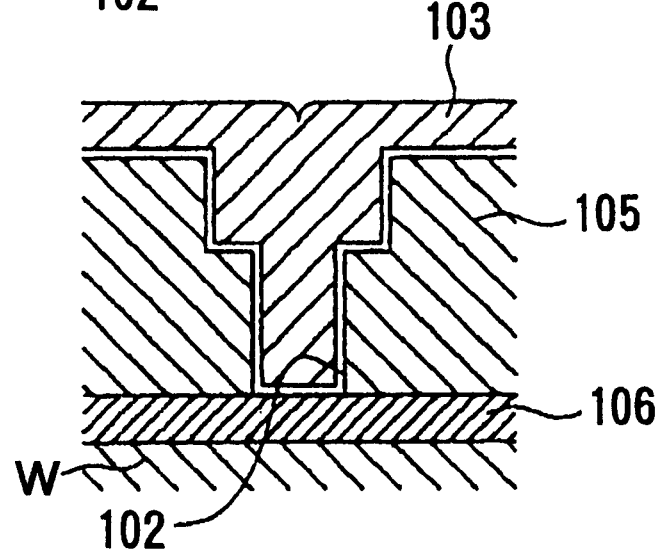

In the plating process chamber 20, the robot 23 picks up the semiconductor wafer W on the loading stage 14 and transfers the wafer W to the preprocess vessels 21 to be preprocessed before plating. Next, the robot 23 transfers the wafer W to the Cu plating vessels 22 for the Cu plating process. In the plating process, a Cu plated layer 103 is formed on the surface of the wafer W that includes the wiring section formed from the wire channel 101 and wire hole 102, as shown in FIG. 2B.

After the plating process is completed, the robot 23 transfers the semiconductor wafer W to the coarse washing vessel 15 to be washed. When the washing process is completed, the robot 13 transfers the wafer W to the storage vessel 16. Here, the wafer W is immersed in a solution and stored for a fixed time until it is to be transferred to the next process.

FIG. 3 shows the construction of the storage vessel 16. As shown in the drawing, the storage vessel 16 includes a vessel 16-1; a wafer cassette 16-2 for accommodating the wafers W; a support platform 16-3 disposed on the bottom of the vessel 16-1 for supporting the wafer cassette 16-2; a solution feeding nozzle 16-4 also disposed on the bottom of the vessel 16-1 for introducing solution into the vessel 16-1; and a collecting gutter 16-5 disposed on the top of the vessel 16-1 for recovering solution that overflows from the top of the vessel 16-1.

After undergoing the washing process in the coarse washing vessel 15, the wafer W is stored on the wafer cassette 16-2 in the vessel 16-1 until the next step. In this example, the next step is the CMP process. The inside of the vessel 16-1 and wafer cassette 16-2 is filled with a storage solution such as pure water. The wafer W is immersed in the pure water until it is transferred to the CMP apparatus. Instead of pure water, the storage solution can be dilute sulfuric acid or another solution capable of preventing the surface of the Cu plated layer 103 from oxidizing.

Figure 4:
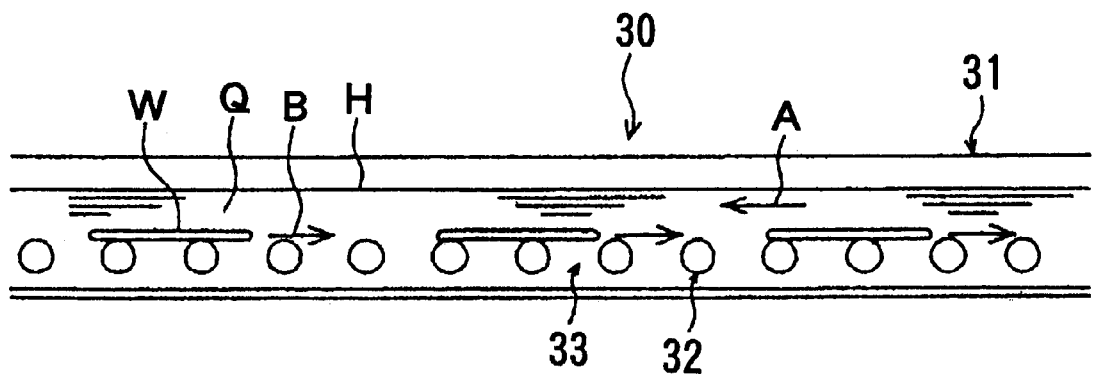
FIG. 4 shows the construction of an underwater conveyor used in the wire plating apparatus.

After the wafer W has been plated and washed in the substrate plating apparatus described above, and after the same has been stored in the storage vessel 16, the wafer W must be transported to the CMP apparatus for the next step. In order transport the wafer W to the CMP apparatus without exposing he wafer W to the air, an underwater substrate conveyor 30 such that shown in FIG. 4 is employed. As shown in the drawing, the underwater substrate conveyor 30 includes a water channel 31 and a roller conveyor 33 disposed on the bottom of the water channel 31 and having a plurality of conveying rollers 32. Pure water Q flows through the water channel 31 in the direction indicated by the arrow A, while maintaining a surface height H.

The underwater substrate conveyor 30 having the construction described above connects the substrate plating apparatus to the CMP apparatus (not shown). The robot 13 extracts the wafer W from the storage vessel 16 and places the same on the roller conveyor 33 in the underwater substrate conveyor 30. The roller conveyor 33 transports the wafer W to the CMP apparatus in the direction indicated by the arrow B, opposite the direction in which the pure water flows. With this method, the wafer W having been plated and washed is transported to the CMP apparatus or the like for the next step without being exposed to the air.

Figure 2C:
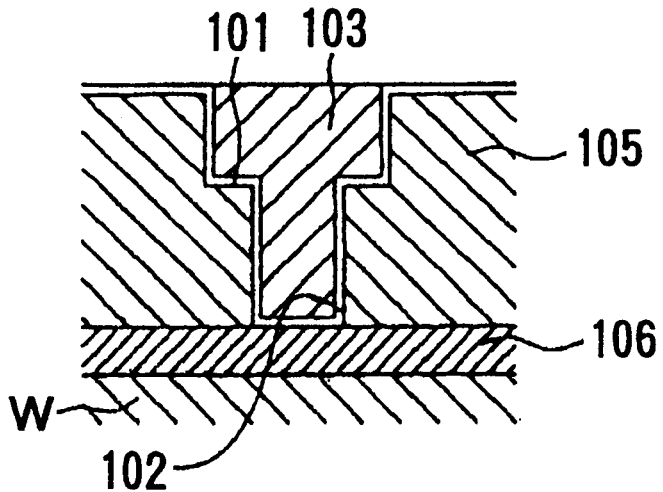

After the semiconductor wafer W is transported to the CMP apparatus, the portion of the Cu plated layer 103 on the surface of the wafer W is removed, leaving the Cu plated layer formed in the wire channel 101 and wire hole 102, as shown in FIG. 2C. Since the wafer W is not exposed to the air after being plated and washed, the surface of the Cu plated layer 103 does not oxidize, nor do particles become attached on the surface.

Figure 5:
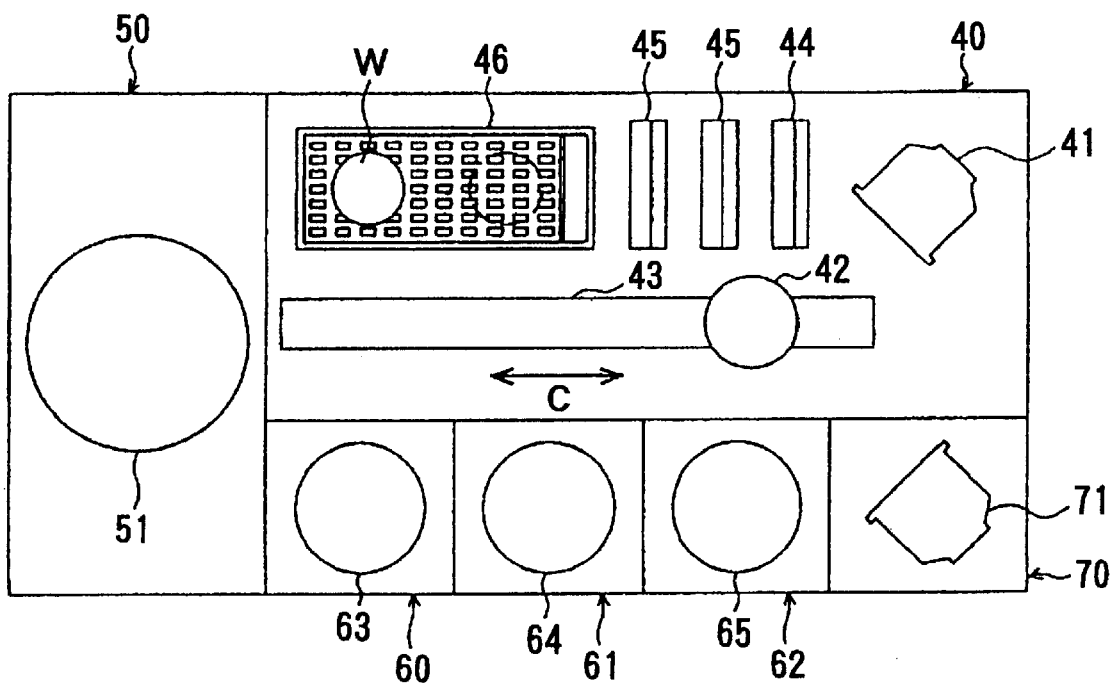
FIG. 5 is a plan view showing a CMP chamber, a washing module, and the like arranged adjacent to the wire plating apparatus of the first embodiment.

FIG. 5 is a plan view showing a CMP chamber, a washing module, and the like arranged adjacent to the wire plating apparatus of the present invention. As shown in the drawing, a Cu plating apparatus 40 includes a loading cassette 41 for accommodating unprocessed semiconductor wafers; a rail 43 extending in the direction indicated by the arrow C; a robot 42 capable of moving reciprocally on top of the rail 43; a preprocess vessel 44; Cu plating vessels 45; and a water channel washing vessel 46. A CMP chamber 50 is disposed adjacent to the Cu plating apparatus 40. The CMP chamber 50 includes a CMP apparatus 51. Washing modules 60, 61, and 62 are also disposed adjacent to the Cu plating apparatus 40 and CMP chamber 50. The washing modules 60, 61, and 62 include washers (or washers and dryers) 63, 64, and 65, respectively. Further, an unloading chamber 70 is provided next to the Cu plating apparatus 40. The unloading chamber 70 is provided with an unloading cassette 71, which contains wafers W to be unloaded.

With this construction, semiconductor wafers W having a wiring area formed of the wire channel 101 and wire hole 102 as shown in FIG. 2A are contained in the loading cassette 41. The robot 42 picks up one of the wafers W and transfers the same to the preprocess vessel 44 to be preprocessed. Next, the robot 42 transfers the wafer W to the Cu plating vessels 45 and the Cu plated layer 103 is formed on the surface of the wafer W, as shown in FIG. 2B.

Subsequently, the robot 42 transfers the wafer W to the CMP apparatus 51. In the CMP apparatus 51, the portion of the Cu plated layer 103 on the surface of the wafer W is removed, leaving only the Cu plated layer formed in the wire channel 101 and wire hole 102, as shown in FIG. 2C in this example. Two Cu plating vessels 45 are provided in consideration for the length of time required to conduct the Cu plating process. In some cases, more than two Cu plating vessels 45 can be provided.

Further, when the Cu plating process includes electroless plating as the primary plating and electrolytic plating as the secondary plating, one of the Cu plating vessels 45 can be used as an electroless plating vessel and the other as an electrolytic plating vessel. Next the wafer W is cleaned in the water channel washing vessel 46. The water channel washing vessel 46 has approximately the same construction has the underwater substrate conveyor 30 shown in FIG. 4 with a cleaning solution such as pure water flowing in the water channel. After the Cu plating process is completed, the wafer W is transferred into the water channel washing vessel 46 at the side of Cu plating vessel 45 and is washed while being transported to the CMP chamber 50 at the side of the water channel washing vessel 46.

After the cleaning process is completed, the robot 42 transfers the wafer W to the CMP apparatus 51. The CMP apparatus 51 polishes the surface of the Cu plated layer to remove the Cu plated layer from the surface of the wafer W, leaving the Cu plated layer 103 formed in the wire channel 101 and wire hole 102, as shown in FIG. 2C. Next, the robot 42 transfers the wafer W to the washers 63, 64, and 65 of the washing modules 60, 61, and 62, respectively, where the wafer W is washed and dried. Finally, the wafer W is inserted in the unloading cassette 71 provided in the unloading chamber 70.

As described above, the Cu plating apparatus 40 is configured to load the semiconductor wafer W in a dry state and unload the same coated with cleaning solution. However, by disposing wet and dried process sections such as the CMP chamber 50, washing modules 60, 61, and 62, and the like adjacent to the Cu plating apparatus 40, it is a simple matter to configure the equipment to perform all the steps in the plating process shown in FIG. 2 continuously. The equipment can also be easily configured to load and unload the semiconductor wafer W in a dry state when conducting all of these processes.

Figure 6:
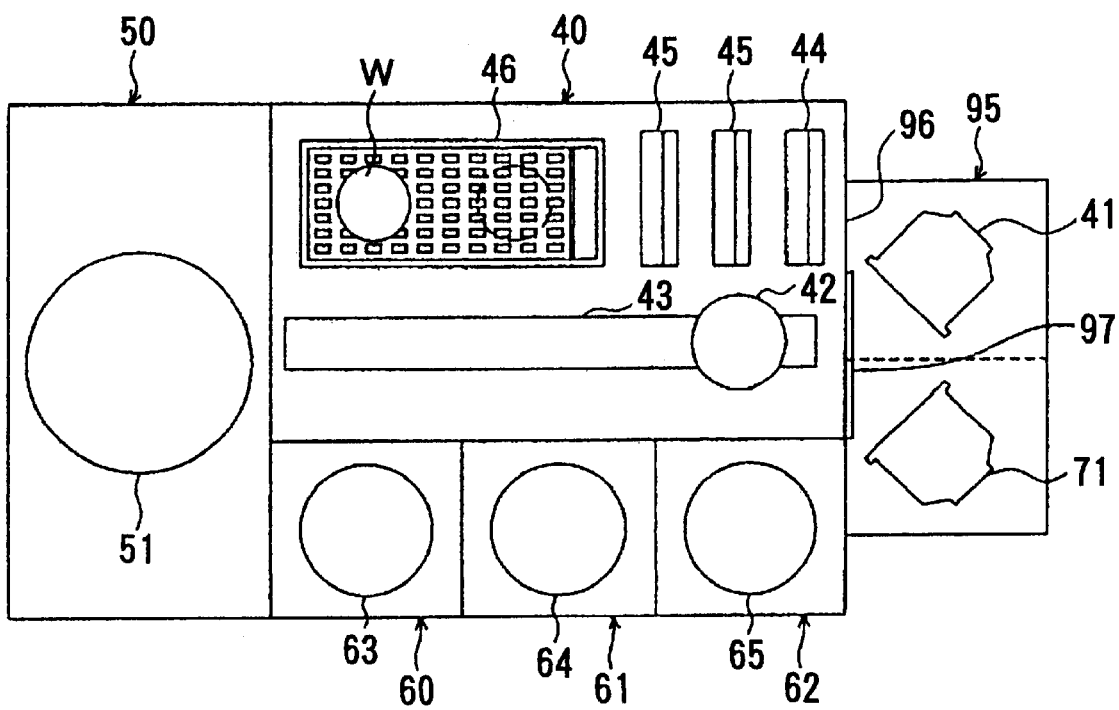
FIG. 6 is a variation of the construction shown in FIG. 5.

The apparatus can also be configured to continuously execute all steps of the plating process shown in FIG. 2 while being isolated from external processes. To achieve this configuration, the section for loading the loading cassette 41 is separated from the Cu plating apparatus 40 and contained in a loading/unloading chamber 95, as shown in FIG. 6. The unloading cassette 71 is also included in the loading/unloading chamber 95. A partition 96 separates the loading/unloading chamber 95 from the Cu plating apparatus 40, but the partition 96 includes a passageway through which the robot 42 can transport the wafers W. A shutter 97 capable of opening and closing is provided over the passageway.

Accordingly, if the entire apparatus with the configuration shown in FIG. 6 is installed in a clean room, the apparatus will not contaminate the clean room, providing that the following relationship exists between the internal pressure in the Cu plating apparatus 40, the internal pressure in the loading/unloading chamber 95, and the air pressure in the clean room:

(Internal pressure in the Cu plating apparatus 40)< (internal pressure in the loading/unloading chamber 95)<(air pressure in the clean room).

Next a substrate plating apparatus according to a second embodiment of the present invention will be described with reference to FIGS. 7 through 13. FIG. 7 is a plan view showing the substrate plating apparatus of the second embodiment. As shown in the drawing, a plating apparatus 80 includes a rail 81 extending along the direction indicated by the arrow A, a conveying robot 82 capable of moving reciprocally in the directions indicated by the arrow A on top of the rail 81, Cu plating vessels 83, and a washing vessel 84. A loading port 85 and an unloading port 86 are also provided for loading wafers into the plating apparatus 80 and discharging them from the plating apparatus 80, respectively.

The conveying robot 82 introduces one wafer to be plated at a time through the loading port 85 into the plating apparatus 80. Each wafer W undergoes a Cu plating process in the Cu plating vessels 83, followed by a washing process in the washing vessel 84, before being discharged from the plating apparatus 80 via the unloading port 86.

Unprocessed semiconductor wafers loaded into the plating apparatus described above are configured as shown in FIG. 2A, wherein the conductive layer 106 and $SiO_2$ insulating film 105 are formed on the surface of the wafer W. A wiring area including the wire channel 101 and wire hole 102 are formed in the insulating film 105 using a lithography etching technique.

When this type of semiconductor wafer W undergoes a Cu plating process in the Cu plating vessels 83, a Cu plated layer 103 is formed on the surface of the wafer W, as shown in FIG. 2B. The barrier layer 104 formed of TiN or the like is also provided between the Cu plated layer 103 and the insulating film 105.

The plating process performed in the Cu plating vessels 83 can be either electroless plating or electrolytic plating. For example, the wafer can be first plated with electroless plating and next with electrolytic plating. After the Cu plated layer 103 is formed on the wafer W in the Cu plating process, the wafer W is washed by a cleaning solution such as pure water in the washing vessel 84. While the wafer W is still coated with the cleaning solution, the conveying robot 82 discharges the wafer W from the plating apparatus 80 via the unloading port 86.

After being discharged from the unloading port 86, the semiconductor wafer W is transferred to the next step while still wet. If the next step is the CMP apparatus (not shown), for example, the CMP apparatus removes the Cu plated layer from the surface of the wafer W, leaving only the Cu plated layer formed in the wire channel 101 and wire hole 102, as shown in FIG. 2C. Hence, by installing the CMP apparatus adjacent to the unloading port 86, the semiconductor wafers need no longer undergo a drying process after being plated and washed.

FIG. 8 is a plan view showing a variation of the substrate plating apparatus of the present invention. As shown in the drawing, a substrate storage vessel 87 filled with a storing solution is provided in the plating apparatus 80. After the conveying robot 82 introduces wafers W one at a time through the loading port 85, there is a waiting period before the unprocessed semiconductor wafers can be plated in the Cu plating vessels 83. During this time, the wafers W are stored in the storage vessel 87, immersed in the storing solution.

The construction of the storage vessel 87 is similar to that shown in FIG. 3. As an alternative to pure water, the storing solution can include dilute sulfuric acid or another solution capable of preventing oxidation on the surface of the Cu plated layer 103. Immersing the wafers W in this type of solution during the waiting period can prevent the formation of an oxidized layer as well as particle contamination, which can impede the plating process.

The following are three possible methods for processing unprocessed semiconductor wafers introduced into the plating apparatus 80.

Processing method No. 1: temporarily store the wafer W in the storage vessel 87; plate the wafer W in the Cu plating vessels 83; wash the wafer W in the washing vessel 84; and discharge the wafer W via the unloading port 86.

Processing method No. 2: plate an unprocessed semiconductor wafer W in the Cu plating vessels 83; wash the wafer W in the washing vessel 84; temporarily store the wafer W in the storage vessel 87; and discharge the wafer W via the unloading port 86.

Processing method No. 3: temporarily store the wafer W in the storage vessel 87; plate the wafer W in the Cu plating vessels 83; wash the wafer W in the washing vessel 84; temporarily store the wafer W in the storage vessel 87; and discharge the wafer W via the unloading port 86.

In other words, by providing a substrate storage vessel filled with storing solution, substrates can be stored in the storage vessel either while waiting to be plated in the plating process section or after undergoing plating and cleaning processes in the plating process and cleaning process sections. As a result, the solution prevents particle contamination and surface oxidation during the waiting period. Further, by preventing the formation of an oxidized layer, it is not necessary to set a non-conducting time in order to remove the oxidized layer from the surface of the substrate.

Figure 9:
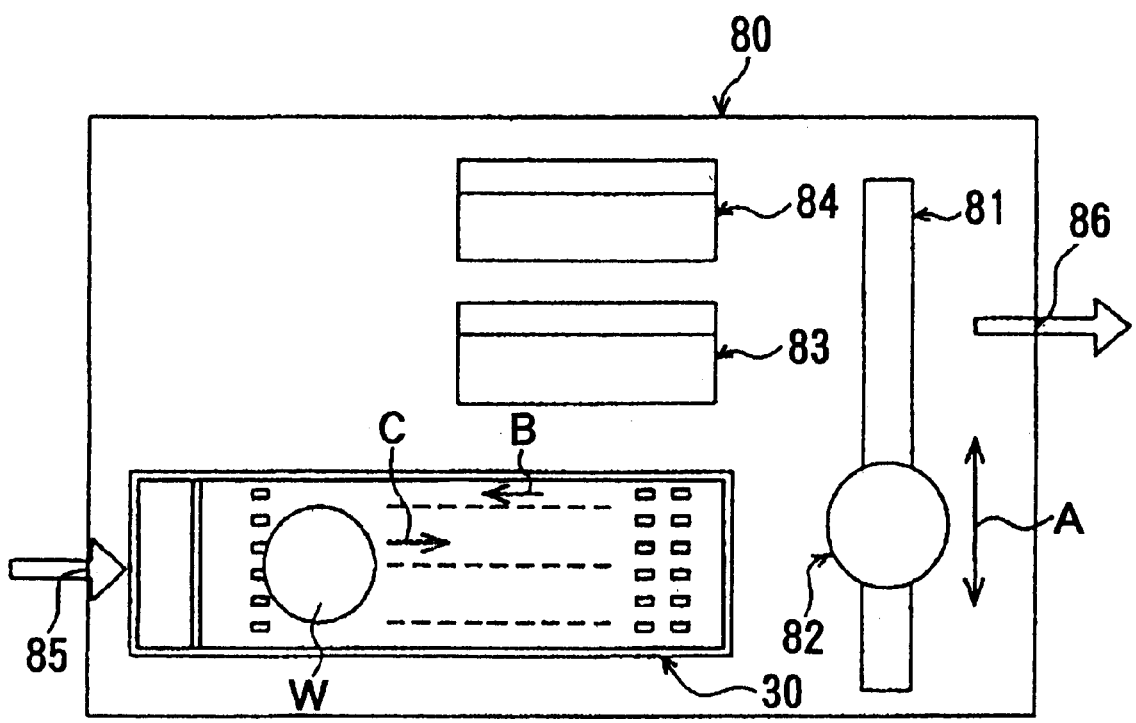
FIG. 9 is a further variation of the apparatus shown in FIG. 7.

FIG. 9 is a plan view showing another variation of the substrate plating apparatus according to the present invention. As shown in the drawing, the underwater substrate conveyor 30 is disposed in the plating apparatus 80, extending from the loading port 85 to a point near the Cu plating vessels 83. The underwater substrate conveyor 30 has a similar construction as that shown in FIG. 4.

The unprocessed semiconductor wafer W is introduced through the loading port 85 and placed on the loading end of the roller conveyor in the underwater substrate conveyor 30. The wafer W is conveyed through pure water Q in the direction indicated by the arrow C, opposite the flow of the pure water Q indicated by the arrow B. Next, the conveying robot 82 transfers the wafer W to the Cu plating vessels 83 to undergo the Cu plating process and to the washing vessel 84 to be washed. Subsequently, the conveying robot 82 discharges the wafer W from the plating apparatus 80 via the unloading port 86.

Figure 10:
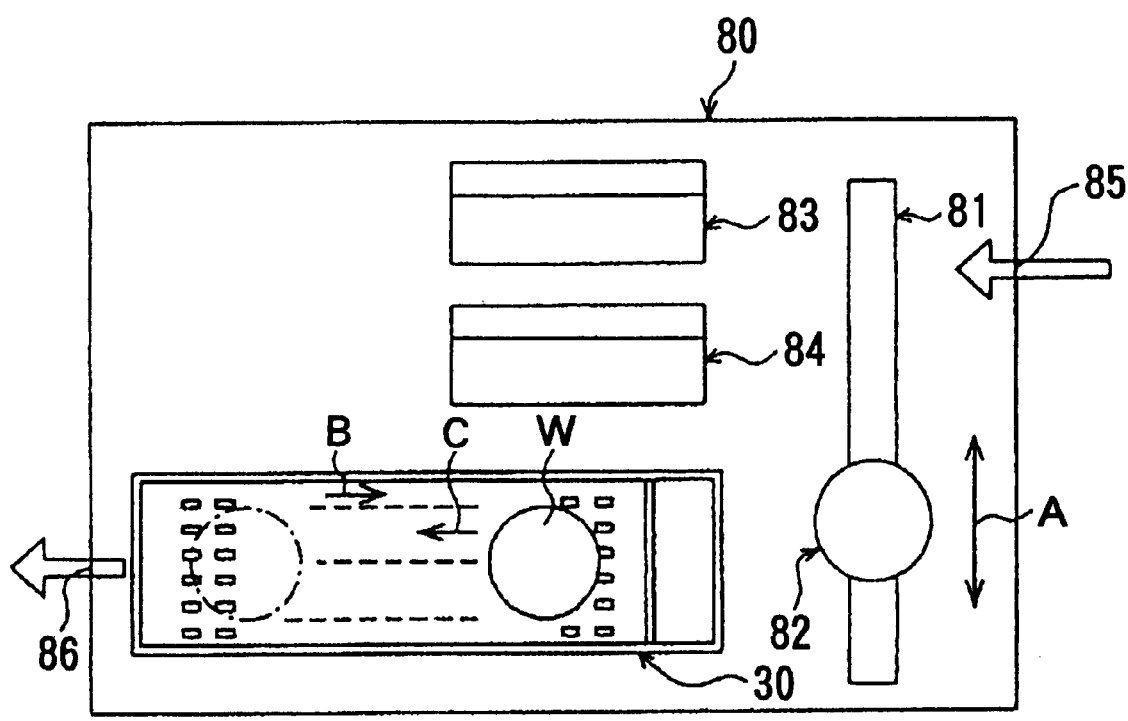
FIG. 10 is a further variation of the apparatus shown in FIG. 7.

FIG. 10 is a plan view showing another variation of the substrate plating apparatus according to the present invention. As shown in the drawing, the underwater substrate conveyor 30 is disposed in the plating apparatus 80 extending from a point near the washing vessel 84 to the unloading port 86. The construction of the underwater substrate conveyor 30 is similar to that of the underwater substrate conveyor 30 shown in FIG. 4.

The conveying robot 82 introduces unprocessed semiconductor wafers W one at a time through the loading port 85. After each wafer W undergoes the Cu plating process in the Cu plating vessels 83 and the washing process in the washing vessel 84, the wafer W is placed on the loading end of the roller conveyor in the underwater substrate conveyor 30. The wafer W is conveyed through the pure water in the direction indicated by the arrow C, opposite the flow of the pure water Q indicated by the arrow B. The underwater substrate conveyor 30 conveys the wafer W to a point near the unloading port 86. A transport apparatus (not shown) disposed outside of the plating apparatus 80 discharges the wafer W while the wafer W is coated with pure water, that is, while the wafer W is still wet.

In other words, the underwater substrate conveyor is provided to transport the substrate through pure water from the loading position near the point that the substrate is introduced into the substrate plating apparatus to a point near the plating process section and/or from a point near the washing process section to the discharge position in the substrate plating apparatus. Accordingly, the substrate is not exposed to the air between the time it is introduced into the substrate plating apparatus until it is transported to the plating process section and from the time the plating and washing processes have been completed until it is transported to the substrate discharge position. Hence, the substrate plating apparatus prevents the surface of the substrate from being contaminated by particles and prevents the formation of an oxidized layer on the surface of the substrate. By preventing the formation of an oxidized layer, it is not necessary to set a non-conducting time in order to remove the oxidized layer from the surface of the substrate after the substrate has been immersed in plating solution.

FIG. 11 is a plan view showing that a plating apparatus 90 for forming a seed layer is disposed adjacent to the loading port 85 and unloading port 86 side of the plating apparatus 80 shown in FIG. 7. A plurality of wafers W contained in a wafer cassette (not shown) is loaded into the plating apparatus 90 through a loading port 91. The plating apparatus 90 performs a process to form a seed layer, described later, on the surface of each semiconductor wafer W.

After the plating apparatus 90 forms a seed layer on the wafer W, the conveying robot 82 introduces the wafer W into the plating apparatus 80 via the loading port 85. After the wafer undergoes the plating and washing processes in the Cu plating vessels 83 and washing vessel 84, respectively, the conveying robot 82 discharges the wafer W back to the plating apparatus 90. A conveying robot (not shown) or the like disposed in the plating apparatus 90 inserts a plurality of the semiconductor wafers into a wafer cassette. The wafer cassette is unloaded through an unloading port 92 provided in the plating apparatus 90.

Unprocessed semiconductor wafers W to have a wire plated layer are processed in the plating apparatus described above. As shown in FIG. 2A, the conductive layer 106 is formed on top of the semiconductor wafer W. The $SiO_2$ insulating film 105 is formed on top of the conductive layer 106. The wire channel 101 and wire hole 102 are formed in the insulating film 105. The barrier layer 104 formed of TiN, TaN, or the like is formed over the entire surface. Since the barrier layer 104 is not a conductor, it is not possible to form a Cu plated layer directly on the surface of the wafer by electrolytic plating. Even when forming a Cu plated layer by electroless plating, a seed layer must first be formed on the surface of the barrier layer 104 in order to begin the growth of the metal (Cu in this case) plating.

Figure 12A:
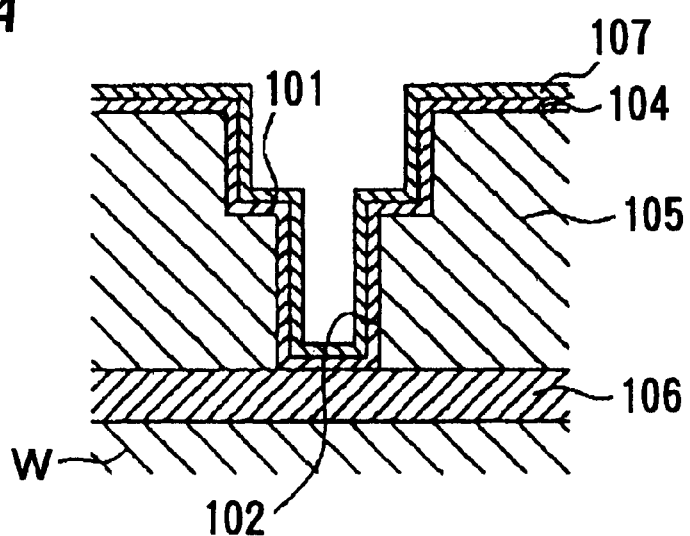
FIG. 12 shows cross-sectional views of a semiconductor wafer to illustrate a sample of a plating process performed using the plating apparatus for forming a seed layer and the substrate plating apparatus of the present invention.

In the plating apparatus 90, a Cu thin film is formed through electroless plating on the surface of the barrier layer 104 as a seed layer 107, shown in FIG. 12A. In order to form a Cu thin film by electroless plating, a palladium process is executed to form numerous palladium nuclei on the surface of the barrier layer 104 for growing the metal. The metal (Cu in this example) grows around the nuclei.

The plating apparatus 90 is not limited to the configuration shown in FIG. 11, but can also be arranged adjacent to the loading port 85 and unloading port 86 side of the plating apparatus 80 shown in FIG. 8. The plating apparatus 90 can also be disposed adjacent to the loading port 85 side of the plating apparatus 80 shown in FIGS. 9 and 10.

Figure 13:
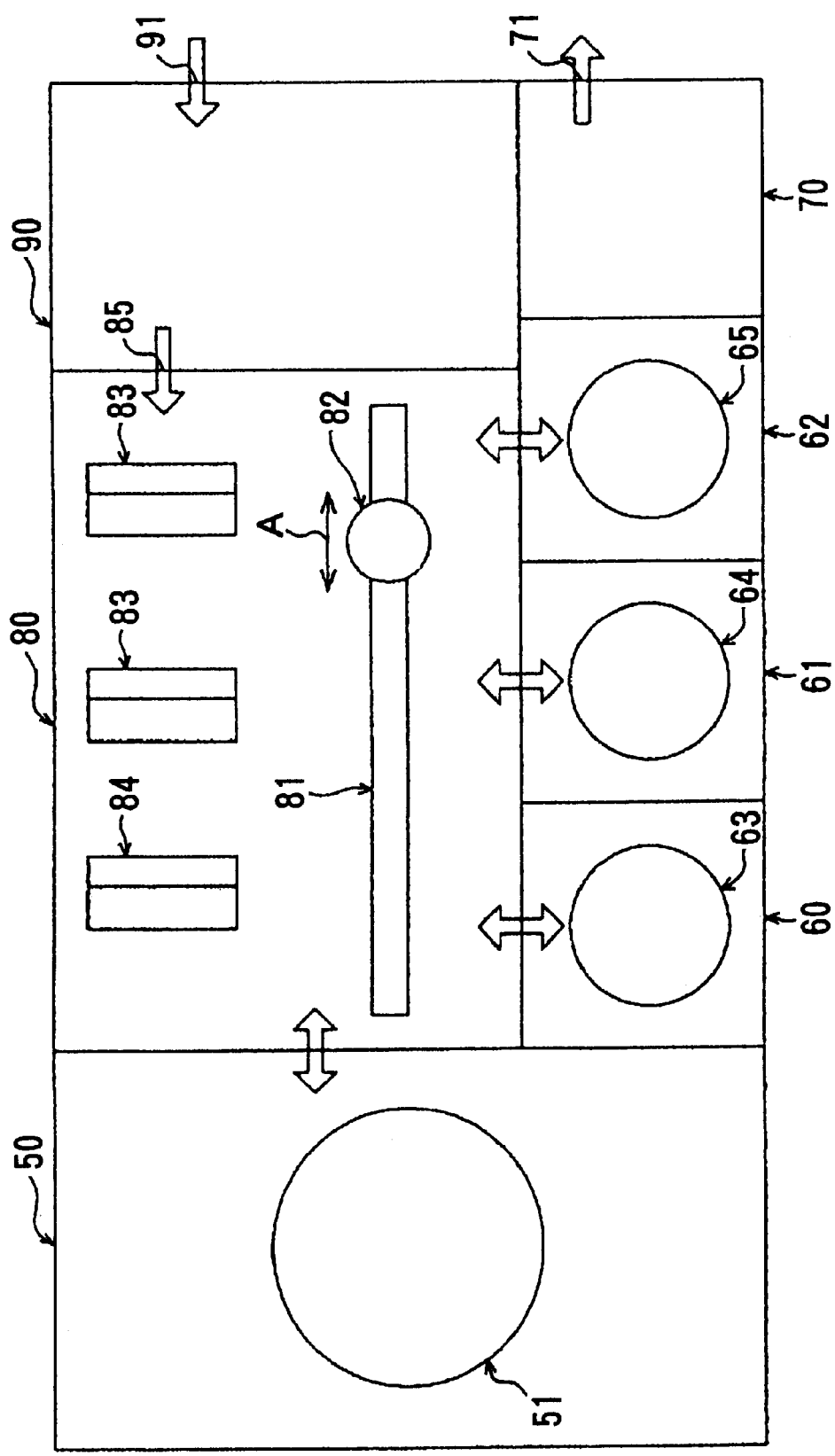
FIG. 13 is a plan view showing that the plating apparatus for forming a seed layer, CMP chamber, washing modules, and unloading chamber are arranged adjacent to the substrate plating apparatus of the second embodiment.

FIG. 13 is a plan view showing that the plating apparatus 90, CMP chamber 50, washing modules 60, 61, and 62, and unloading chamber 70 are arranged adjacent to the plating apparatus 80 shown in FIG. 7. As described above, the CMP chamber 50 includes the CMP apparatus 51, and the washing modules 60, 61, and 62 are provided with the washers 63, 64, and 65, respectively.

Figure 12B:
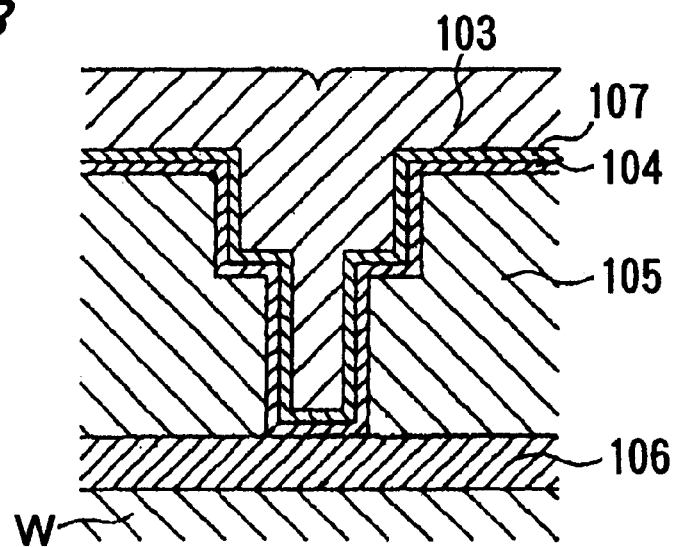

In the plating apparatus 90 shown in FIG. 13, the seed layer 107 is formed on the surface of the barrier layer 104, as shown in FIG. 12A. The conveying robot 82 introduces semiconductor wafers W one at a time into the plating apparatus 80. In the Cu plating vessels 83, the Cu plated layer 103 is formed over the seed layer 107 as shown in FIG. 12B. Subsequently, the wafer W is washed in the washing vessel 84 and transferred to the CMP apparatus 51 while still coated with the cleaning solution. The CMP apparatus 51 removes the Cu plated layer from the surface of the wafer W, leaving only the Cu plated layer formed in the wire channel 101 and wire hole 102, as shown in FIG. 2C.

Next, the wafer W is washed in the washers 63 and 64 and washed and dried in the washer and dryer 65. After the drying process is completed, a plurality of wafers W is loaded into a wafer cassette (not shown) provided in the unloading chamber 70. The wafer cassettes are unloaded via the unloading port 71.

In the example described above, the plating apparatus 90 for forming seed layer, CMP chamber 50, washing modules 60, 61, 62, and unloading chamber 70 are arranged adjacent to the plating apparatus 80 shown in FIG. 7. However, it is obvious that the same components can also be arranged adjacent to any of the plating apparatus 80 shown in FIGS. 8, 9, and 10.

In the plating apparatus 80 described above, the semiconductor wafers W are introduced into the plating apparatus 80 one at a time, washed in the Cu plating vessels 83 and washing vessel 84, and subsequently discharged from the plating apparatus 80 one at a time. However, it is also possible to load semiconductor wafers W continuously into the Cu plating apparatus and process the wafers W one at a time without inserting them into a cassette. It is also possible to greatly reduce the formation of an oxidized layer as well as particle contamination on the surface of the wafer W. By arranging the apparatus required for other steps in the process adjacent to the plating apparatus 80, it is possible to eliminate such steps as the drying process, even when the wafer must be moved between different apparatus, and to reduce the overall scale of equipment. Accordingly, it is easy to construct a wire plating apparatus for semiconductor wafers capable of reducing the required installation area.

In the embodiments described above, a wire plating apparatus for semiconductor wafers was employed as the example of the substrate plating apparatus. However, the substrate used in this plating process is not limited to a semiconductor wafer; nor is the area to be plated limited to the wiring area formed on the surface of the substrate. Further, Cu plating was used in the descriptions, but the present invention is not limited to Cu plating.

INDUSTRIAL APPLICABILITY

The present invention can be used suitably as a plating apparatus for forming a wiring layer in a wiring section comprising fine channels and fine holes formed in the surface of a substrate, such as a semiconductor wafer or the like. Accordingly, the present invention can be used in the semiconductor industry for the fabrication of semiconductor devices.

What is claimed is:

1. An apparatus, comprising:
   a plating process section for plating a surface of a substrate;
   a washing process section for washing the substrate; and
   a substrate storage vessel containing a storing solution for storing the substrate in an immersed state;
   wherein said plating process section, said washing process section, and said substrate storage vessel are integrally formed as one unit.

2. An apparatus according to claim 1, wherein the storing solution is water, dilute sulfuric acid, or another solution capable of preventing the plating surface of the substrate from oxidizing.

3. An apparatus according to claim 1, wherein said storage vessel includes a vessel, a support platform disposed on a bottom of the vessel for supporting substrates to be stored, a solution feeding nozzle for introducing solution into the vessel, and a collecting gutter for recovering solution that overflows from the vessel.

4. An apparatus according to claim 1, wherein said substrate storage vessel is arranged to store the substrate after the substrate has been washed in the washing process section.

5. An apparatus, including a substrate plating apparatus comprising:
   a plating process section for plating a surface of a substrate;
   a washing process section for washing the substrate; and
   an underwater substrate conveyor for conveying the substrate through a channel containing flowing solution;
   wherein said plating process section, said washing process section, and said substrate storage vessel are integrally formed as one unit.

6. An apparatus according to claim 5, wherein the storing solution is water, dilute sulfuric acid, or another solution capable of preventing the plating surface of the substrate from oxidizing.

7. An apparatus according to claim 5, wherein said underwater substrate conveyor is arranged to convey the substrate that has been plated in the plating process section.

8. An apparatus according to claim 5, wherein said underwater substrate conveyor is arranged to convey the substrate that has been washed in the washing process section.

9. An apparatus according to claim 5, wherein said underwater substrate conveyor includes a water channel and a roller conveyer disposed on a bottom of the water channel and comprising a plurality of conveyer rollers on the bottom of the water channel.

10. An apparatus according to claim 9, wherein water flows through the water channel while maintaining a surface height sufficient to immerse the substrate.

11. An apparatus according to claim 5, wherein said underwater substrate conveyor is arranged to transport the substrate in a direction opposite to that in which the solution flows.

12. An apparatus according to claim 5, and further comprising a CMP chamber, wherein said underwater substrate conveyor is arranged to transport the substrate to the CMP chamber.

13. An apparatus according to claim 5, and further comprising a CMP chamber including a CMP apparatus disposed adjacent to the plating apparatus.

14. An apparatus according to claim 12, wherein said CMP chamber is integrally housed with said plating process section, said washing process section, and said underwater substrate conveyer in the one unit.

15. An apparatus according to claim 5, and further comprising a CMP chamber including a CMP apparatus wherein the washing process section is arranged so that the substrate is washed while being transported to the CMP chamber after a plating process is completed.

16. An apparatus according to claim 5, wherein said plating process section comprises a Cu plating process section.

* * * * *